United States Patent [19]

Ohe

[11] Patent Number: 4,553,225
[45] Date of Patent: Nov. 12, 1985

[54] METHOD OF TESTING IC MEMORIES

[75] Inventor: Yoshikazu Ohe, Kawasaki, Japan

[73] Assignee: Fujitsu Limited, Kawasaki, Japan

[21] Appl. No.: 423,645

[22] Filed: Sep. 27, 1982

[30] Foreign Application Priority Data

Sep. 26, 1981 [JP] Japan .................................. 56-151439

[51] Int. Cl.$^4$ ........................ G11C 11/40; G11C 29/00
[52] U.S. Cl. ....................................... 365/201; 371/21;
371/28; 324/158 T
[58] Field of Search ................ 365/201, 228, 227, 226;
371/21, 28; 324/73 R, 158 T

[56] References Cited

U.S. PATENT DOCUMENTS

| 3,916,306 | 10/1975 | Patti | 371/28 |
| 4,253,059 | 2/1981 | Bell et al. | 324/73 R |
| 4,335,457 | 6/1982 | Early | 371/21 |
| 4,418,403 | 11/1983 | O'Toole et al. | 365/201 |
| 4,503,538 | 3/1985 | Fritz | 371/21 |

FOREIGN PATENT DOCUMENTS

| 2949490 | 6/1981 | Fed. Rep. of Germany | 365/201 |
| 54-161238 | 12/1979 | Japan | 365/201 |
| 55-160400 | 12/1980 | Japan | 365/201 |
| 57-167196 | 10/1982 | Japan | 365/228 |
| 8200896 | 3/1982 | PCT Int'l Appl. | 365/201 |

OTHER PUBLICATIONS

Chin, "Core Storage Unit Tester," IBM Technical Disclosure Bulletin, vol. 12, No. 3, Aug. 1969, pp. 447-448.

Primary Examiner—Stuart N. Hecker
Assistant Examiner—Glenn A. Gossage
Attorney, Agent, or Firm—Staas & Halsey

[57] ABSTRACT

In a method of testing IC memories, at first, predetermined data such as all "0" or all "1" is written into an IC memory at a normal-operation power-supply voltage, and the written data is read out and confirmed. Next, the power-supply voltage is lowered and is then returned to the normal-operation power-supply voltage after a predetermined period of time has passed in order to determine whether the stored data is in agreement with the data as initially written. When the stored data is in agreement with the initially written data, the power-supply voltage is further lowered to repeat the above-mentioned procedure. The above-mentioned procedure is further repeated when the stored data is in agreement with the initially written data and a minimum data-holding limit voltage which is capable of holding the written data is thereby determined.

5 Claims, 7 Drawing Figures

METHOD OF TESTING IC MEMORIES

BACKGROUND OF THE INVENTION

The present invention relates to a method of testing IC memories. More specifically, it relates to a method of testing memory cells such as random access memory (RAM) cells.

According to the conventional method of testing IC memories, the performance of unstable elements in the memory cells of the semiconductor device is presumed on the basis of maximum and minimum power-supply voltages. In the case of the RAM, the normal operation voltage is usually $-5.2$ volts with a permissible range of $\pm 5\%$. Therefore, maximum and minimum operation limit voltages are applied to determine whether the contents of the IC memory are destroyed. When IC memories are tested by the above method, however, it becomes difficult to carry out testing by changing the voltage when peripheral circuits such as decoders, drivers, and output circuits become inoperative. With the above method, furthermore, it is difficult to determine the operation limit (data-holding limit) of the memory cells which are still operating at the operation voltage. Therefore, it is not possible to find cells which have a poor limit voltage for holding data, i.e., which make up a small margin of the cells in the cell array.

SUMMARY OF THE INVENTION

An object of the present invention is to provide a method of testing IC memories, which is capable of easily and effectively finding memory elements that have an unstable cell margin.

Another object of the present invention is to provide a method of testing IC memories which is capable of determining the minimum data-holding limit voltages of the memory cells.

In order to achieve the above-mentioned object, the method of testing IC memories according to the present invention comprises the steps of writing predetermined data into an IC memory at a normal-operation power-supply voltage, and reading and confirming the correctness of the written data; lowering the operation power-supply voltage when the stored data is in agreement with the initially written data; returning the operation power-supply voltage to said normal-operation power-supply voltage after a predetermined period of time; confirming whether the stored data is in agreement with said data as initially written; and at still lower power supply voltages repeating the above-mentioned procedure until a minimum-operation power-supply voltage which is capable of holding the initially written data is found.

Further features and advantages of the present invention will be apparent from the ensuing description with reference to the accompanying drawings to which, however, the scope of the invention is in no way limited.

DESCRIPTION OF THE PREFERRED EMBODIMENT

Figure 1:
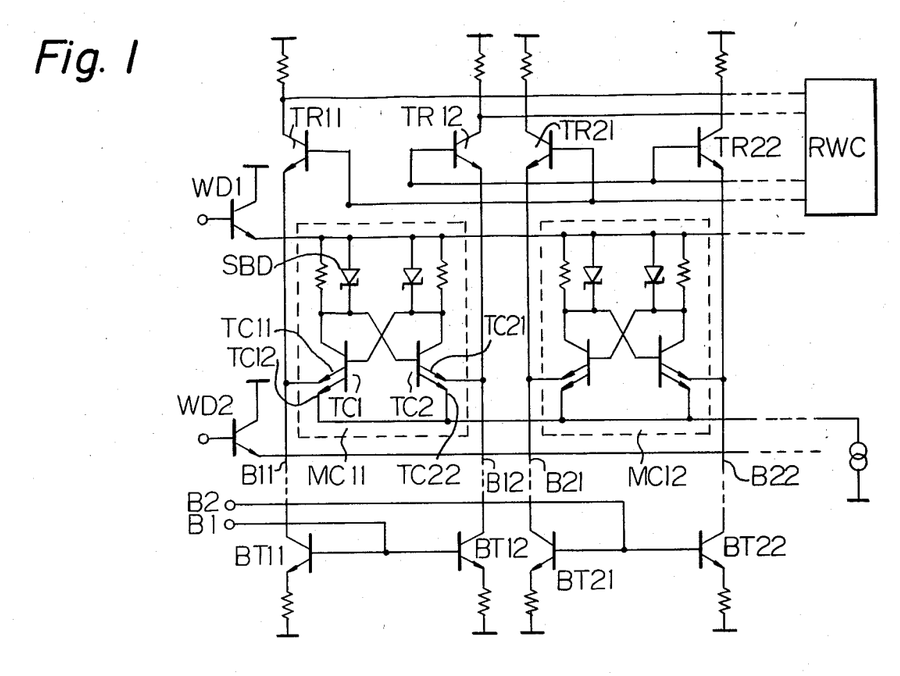
FIGS. 1 and 2 are block diagrams of a RAM semiconductor device to which the method of the present invention is adapted.

FIG. 1 is a diagram illustrating the setup of a semiconductor memory device to be tested by the method of the present invention and in which a plurality of memory cells $MC_{11}$, $MC_{12}$, ... are arrayed in lines and columns. The symbols $WD_1$, $WD_2$, ... denote line selection means for selecting lines, the symbols $B_1$, $B_2$, $BT_{11}$, $BT_{12}$, ... denote column selection means for selecting columns, and the symbols $TR_{11}$, $TR_{12}$, $TR_{21}$, $TR_{22}$, ... denote reading transistors which are provided for each of the columns and which are used for reading the data of the memory cells $MC_{11}$, $MC_{12}$, ... . These transistors are also used for writing data into the memory cells $MC_{11}$, $MC_{12}$, ... . The symbol RWC denotes a reading/writing circuit. As is well known, the memory cells $MC_{11}$ and $MC_{12}$ comprise flip-flop circuits including multi-emitter transistors $TC_1$ and $TC_2$. The emitters $TC_{12}$ and $TC_{22}$ are connected to a data-holding current supply, and the emitters $TC_{11}$ and $TC_{21}$ are connected to the bit lines $B_{11}$ and $B_{12}$.

The semiconductor memory device roughly operates as mentioned below. The memory cell $MC_{11}$ is selected by selecting the line selection means $WD_1$ and the column selection means $B_1$. If the transistor $TC_1$ is conductive and the transistor $TC_2$ is non-conductive in the memory cell $MC_{11}$, the electric current flowing from the emitter $TC_{12}$ to the data-holding current supply is caused to flow from the emitter $TC_{11}$ to the bit line $B_{11}$. The emitter of the reading transistor $TR_{11}$ is coupled to the emitter $TC_{11}$ of the transistor $TC_1$ and the emitter of the reading transistor $TR_{12}$ is coupled to the emitter $TC_{21}$ of the transistor $TC_2$, so that they work as current switches. Therefore, current from the emitter $TC_{11}$ of the transistor $TC_1$ is allowed to flow into the bit line $B_{11}$, and current from the emitter of the reading transistor $TR_{12}$ is allowed to flow into the bit line $B_{12}$. Therefore, the collector of the reading transistor $TR_{11}$ assumes a high level, the collector of the reading transistor $TR_{12}$ assumes a low level, and the data stored in the memory cell $MC_{11}$ is read by the reading/writing circuit RWC.

Figure 2:
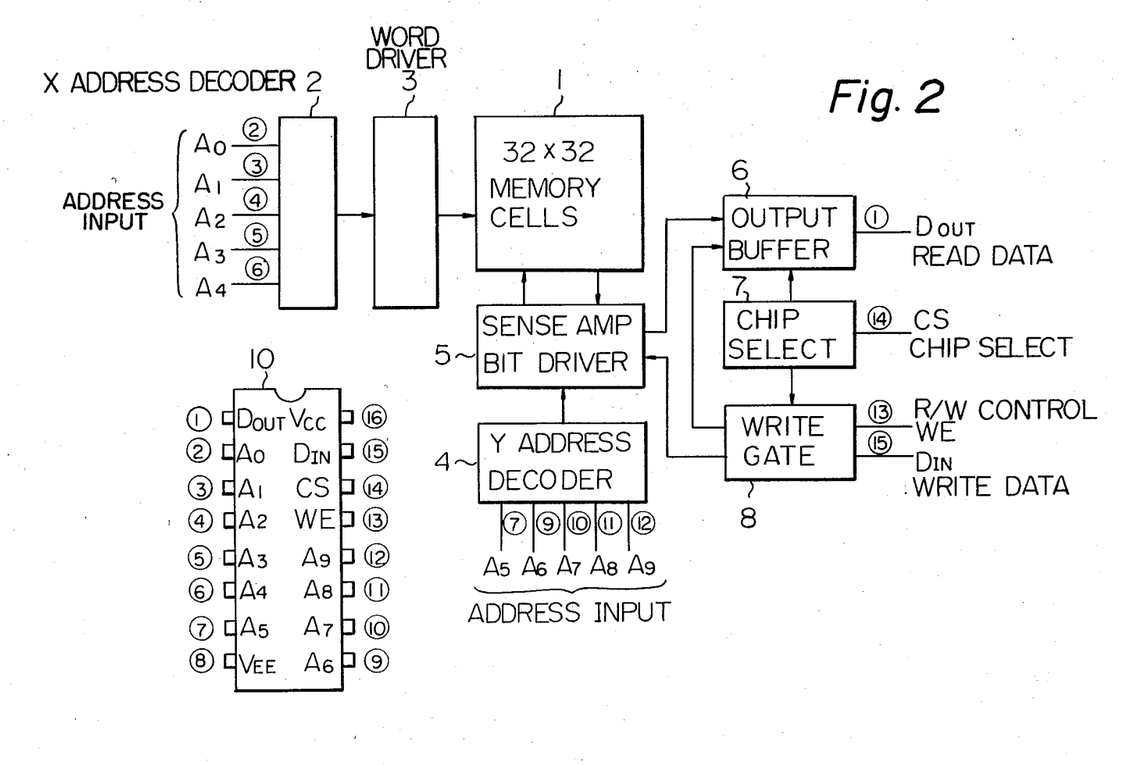

FIG. 2 shows peripheral circuits of the semiconductor device shown in FIG. 1. In FIG. 2, X address inputs are supplied via an X address decoder 2 and a word driver 3 to a memory device 1, and Y address inputs are supplied via a Y address decoder 4 and a sense amp bit driver 5 to the memory device 1. The sense amp bit driver 5 is connected to an output buffer 6, a write gate 8 is connected to the sense amp bit driver 5 and the output buffer 6, and a chip selector 7 is connected to the output buffer 6 and the write gate 8. In FIG. 2, 10 illustrates a package which shows an arrangement of a group of terminals of the semiconductor device. Usually, the terminal $V_{CC}$ is grounded and the terminal $V_{EE}$ has applied thereto $-5.2$ volts.

In the circuit shown in FIG. 2, when the chip select CS is at a high level (such as over $\simeq -0.9$ V), the IC memories are placed in a non-selected state, the write operation and the read operation cannot be carried out, and the read output $D_{out}$ is at a low level (such as below $\simeq -1.7$ V). When the chip select CS is at a low level, the IC memories are placed in a selection state and the write and read operation can be carried out.

When the chip select CS is at a low level and the R/W control WE is at a high level, the address signals applied to the terminals $A_0 \sim A_9$ select one bit and the stored information is read out at the terminals $D_{out}$. When the address inputs are held constant, the output state is not changed. If the address inputs are varied, the output from a new address is obtained after a predetermined time (access time).

When the R/E control WE is placed at a low level at the time when the chip select C/S is at a low level, the information specified in the write data $D_{in}$ is written into the address specified by the address inputs. The information written when the write data $D_{in}$ is at a high level is read out at the read data $D_{out}$ as a high level. Similarly, when the write data $D_{in}$ is at a low level, a low level output is obtained at $D_{out}$. The read data $D_{out}$ is at a low level when the R/W control WE is at a low level.

Figure 3A:
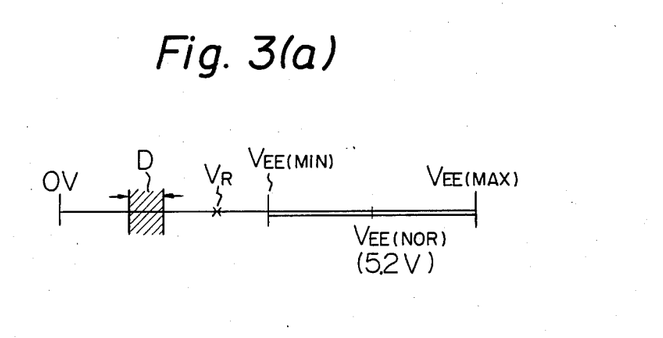
FIG. 3(a) is a diagram of the relationships among a normal operation voltage of an IC memory, a maximum operation limit voltage, a minimum operation limit voltage, and a range of minimum data-holding limit voltages according to the present invention.

The method of testing IC memories according to an embodiment of the present invention will be described below in detail. FIG. 3(a) illustrates the relationships among a normal operation power-supply voltage $V_{EE(NOR)}$ (for instance, $-5.2$ volts) of an IC memory, a maximum operation limit voltage $V_{EE(MAX)}$, a minimum operation limit voltage $V_{EE(MIN)}$, and a minimum data-holding limit range D of the IC memory. In FIG. 3(a), $V_R$ denotes the data-holding limit voltage of a cell.

Figure 3B:
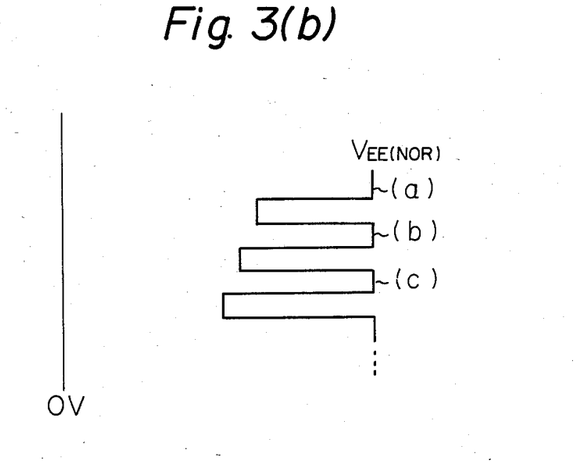
FIG. 3(b) is a diagram of the steps in the method of testing IC memories according to the present invention.

In FIG. 3(b), first predetermined data (such as all "0" or all "1") is written at a normal operation voltage $V_{EE(NOR)}$, i.e., at a point (a), and the thus written data is read out and is confirmed as the same as the stored data. The operation voltage is then lowered and returned to the normal operation voltage after a predetermined period of time has passed, as indicated by point (b), in order to determine whether the stored data is in agreement with the initially written data. When the data is in agreement, the voltage is further lowered and is returned to the normal operation voltage after a predetermined period of time has passed, as indicated by point (c), in order to determine whether the stored data is in agreement with the initially written data. The above-mentioned operation is repeated in order to find a minimum data-holding limit voltage which is capable of holding the written data. Thus, elements having unstable cells can easily be found by comparing them with the minimum data-holding limit voltage of a normal cell which has been inspected and confirmed before hand. Elements having a poor performance with regard to minimum data-holding limit voltage have narrow cell margins and usually develop soft errors when the memory apparatus is operated.

Figure 4:
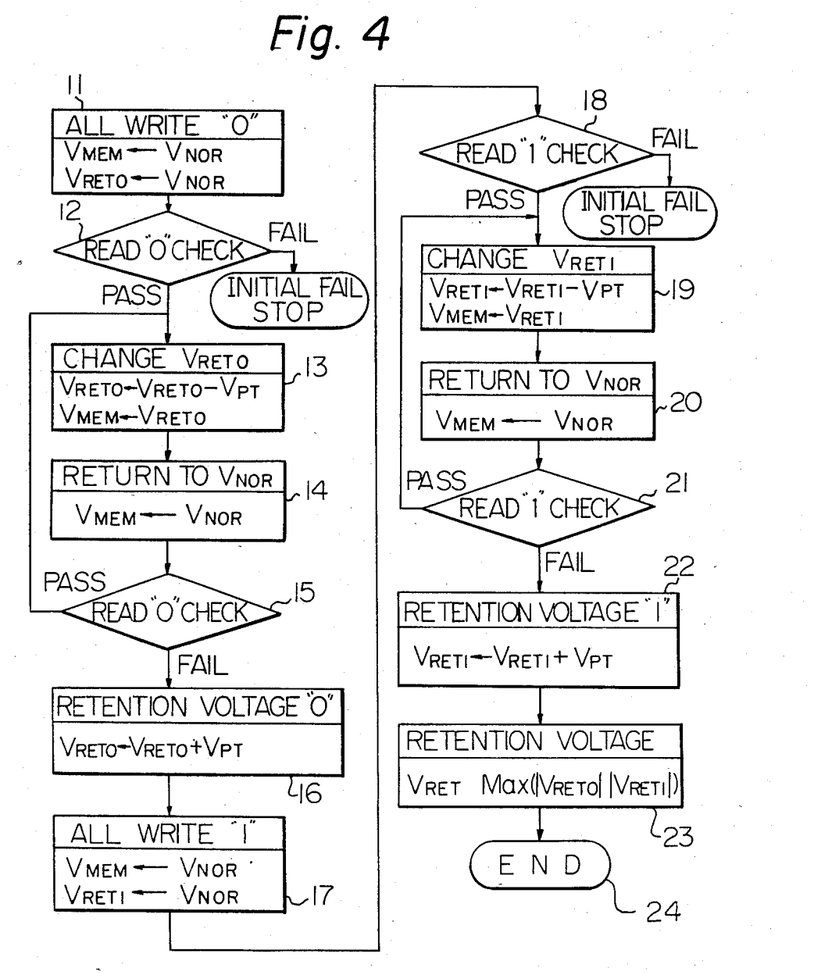
FIGS. 4 and 5 are flow charts of the steps in the method of testing memories according to the present invention.

FIG. 4 is a flow chart illustrating the steps of the method according to the present invention. In the block 11, a normal voltage ($V_{NOR}$) such as $-5.2$ V is set as a memory supply voltage ($V_{MEM}$) and a retention voltage for "0" ($V_{RET0}$) and the information "0" is written into all the memory cells. In the block 12, the written information "0" is read in order to be checked. If the read information coincides with the written information, the procedure is transferred to the blocks 13~15. In the block 13, the memory supply voltage ($V_{MEM}$) is decreased by a voltage pitch or amount ($V_{PT}$) and, after a predetermined time, the voltage is again returned to the normal voltage ($V_{NOR}$) and the initially written information "0" is read and checked. This procedure is repeated until the read information does not coincide with the initially written information. When the read information does not coincide with the initially written information, the procedure is transferred to the block 16 where the retention voltage for "0" is increased by one voltage pitch ($V_{PT}$).

Next, in the block 17, the normal voltage ($V_{NOR}$) is set as a memory supply voltage ($V_{MEM}$) and a retention voltage for "1" ($V_{RET0}$) and information "1" is written into all the memory cells. In the blocks 18~21, the procedure in the blocks 12~15 is repeated for the information "1", and in the block 22, the retention voltage for "1" is determined.

Finally, in the block 23, the larger absolute value between the retention voltage for "0" ($V_{RET0}$) and the retention voltage for "1" ($V_{RET1}$) is defined as the retention voltage $V_{RET}$.

For the purpose of avoiding a noise effects or an $\alpha$-ray radiation effect on a memory cells, the memory cells should have a retention voltage $V_{RET}$ larger than the predetermined value.

Figure 5:
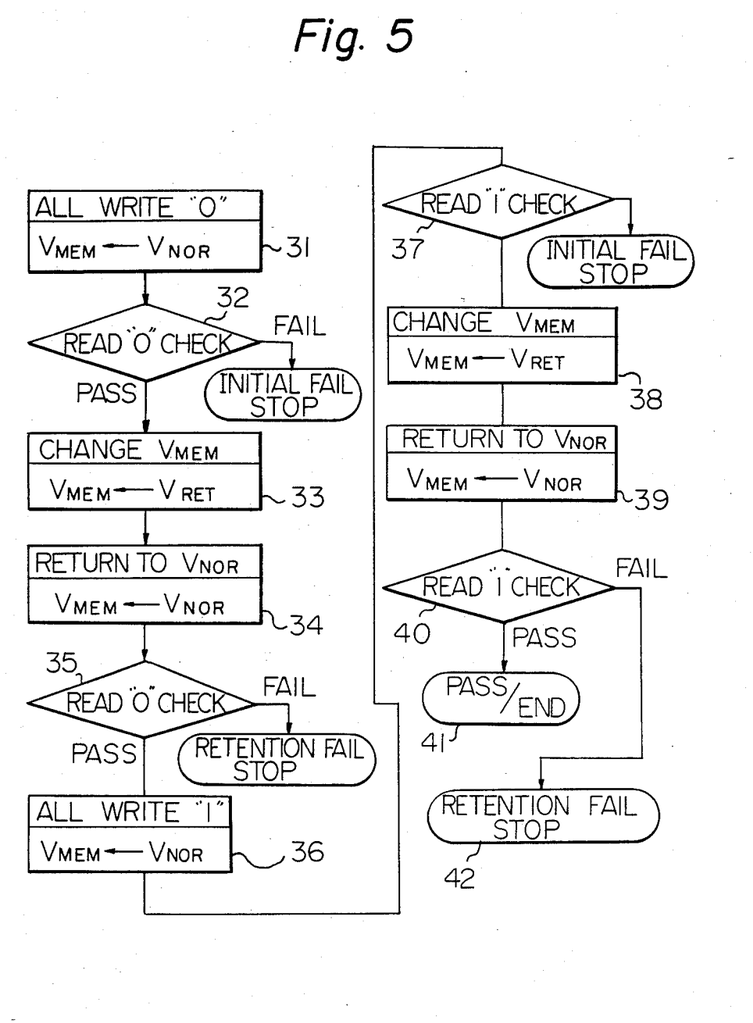

FIG. 5 is a flow chart for determining whether the memory cells have a retention voltage $V_{RET}$ larger than the predetermined value. In the block 31, the normal voltage $V_{NOR}$ is set as the memory power supply voltage $V_{MEM}$ and the information "0" is written into all the cells. In the block 32, the written information "0" is checked. After the written information "0" is checked, the memory power supply voltage $V_{MEM}$ is changed to the retention voltage $V_{RET}$ in the block 33, and in the block 34, the voltage $V_{MEM}$ is returned to the normal voltage $V_{NOR}$. In the block 35, the information "0" is read out and checked, and after the information "0" is checked, a similar procedure for checking the information "0" is carried out for the information "1" in the blocks 36~40. After checking in the block 40, the memory cell is assumed to be of good quality.

The above-mentioned test according the present invention can be carried out by using IC memory testers, such as XINCOM III (5581) produced by Fairchild (U.S.A.), J 387 produced by Teladyne (U.S.A.), M1 produced by Macrodata (U.S.A.), and T-320/70 produced by Takeda Riken (Japan).

Figure 6:
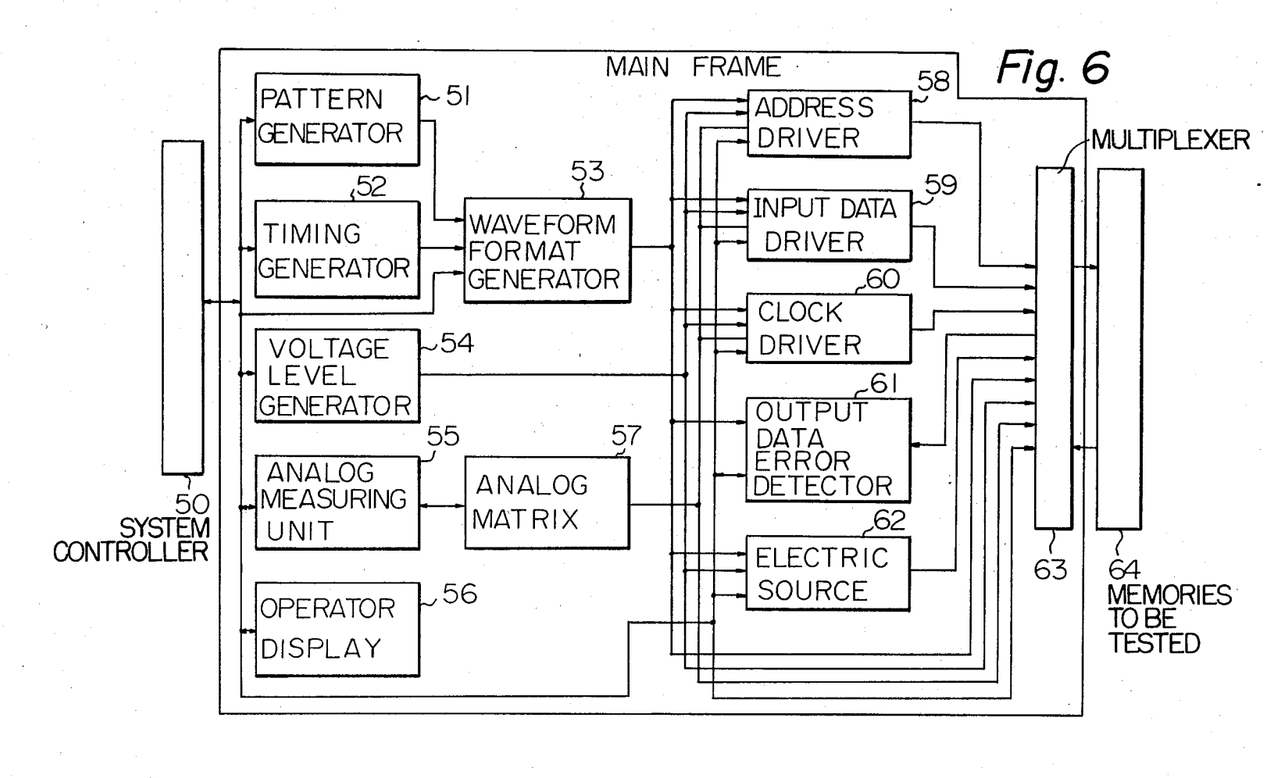
FIG. 6 is an example of the apparatus for carrying out the method of the present invention.

An example of an IC tester is shown in FIG. 6. In FIG. 6, reference numeral 50 designates a system controller, reference numerals 51, 52 and 53 designate a pattern generator, a timing generator, and a waveform format generator, respectively, and reference numerals 54, 55, 56 and 57 designate a voltage level generator, an analog measuring unit, an operator display, and an analog matrix 57, respectively. Reference numerals 58, 59, 60, 61, 62 and 63 designate an address driver, an input data driver, a clock driver, an output data error detector, an electric source, and a multiplexer, respectively, and reference numeral 64 designates a remote test circuit where the memories to be tested are placed.

The aforementioned method of the present invention of testing IC memories is capable of finding even defective elements regarded as non-defective elements by the conventional method that relied upon maximum and minimum power-supply voltage operation-limit values.

Although the foregoing description has dealt with the case of the RAM of FIG. 1, the method according to the present invention should in no way be limited thereto but can be applied to every IC memory.

I claim:

1. A method of testing a memory comprising a memory cell array, a peripheral circuit including a decoder circuit, a driver circuit and an output circuit, and a common operation power supply voltage for supplying a common power-supply voltage to both the memory cell array and the peripheral circuit, said method comprising the steps of:
    (a) storing predetermined initially written data into the memory as stored data at a normal common operation power-supply voltage, and reading and confirming whether the initially written data agrees with the stored data;
    (b) lowering the common operation power-supply voltage when the stored data is in agreement with the initially written data;
    (c) returning the common operation power-supply voltage to said normal common operation power-supply voltage after a predetermined period of time;
    (d) confirming whether the stored data is in agreement with the initially written data; and
    (e) repeating steps (b)–(d) at still lower common operation power-supply voltages until a minimum-operation power-supply voltage which is capable of holding the stored data in agreement with the initially written data is determined.

2. A method of testing a memory according to claim 1, wherein said predetermined data is all "0".

3. A method of testing a memory according to claim 1, wherein said predetermined data is all "1".

4. A method of testing a memory, comprising the steps of:
    (a) writing data into memory cells of the memory at a normal operating voltage;
    (b) lowering the operating voltage to a test voltage for a predetermined period of time;
    (c) returning the operating voltage to normal;
    (d) reading out the data and comparing it to the written data after the operating voltage is returned to normal;
    (e) repeating steps (b)–(d) in cycles using successively lower values for the test voltage until the data written into the memory cells does not match the data read out; and
    (f) designating, as a minimum memory cell data holding voltage limit, the test voltage value used in the cycle immediately before the data written into the memory cells does not match the data read out.

5. A method of testing a memory according to claim 4, wherein the operating voltage supplied to peripheral circuits in the memory and associated with the memory cells is lowered to the first test voltage during step (b).

* * * * *

UNITED STATES PATENT AND TRADEMARK OFFICE
CERTIFICATE OF CORRECTION

PATENT NO. : 4,553,225
DATED : November 12, 1985
INVENTOR(S) : YOSHIKAZU OHE

It is certified that error appears in the above-identified patent and that said Letters Patent is hereby corrected as shown below:

Col. 1, line 33, "memories," should be --memories--;

line 51, "written;" should be --written--.

Col. 4, line 22, "effect" should be --effects--;

"a" should be --the--;

line 24, "the" should be --a--;

line 41, after "according" insert --to--.

Signed and Sealed this

Eighteenth Day of March 1986

[SEAL]

Attest:

DONALD J. QUIGG

Attesting Officer

Commissioner of Patents and Trademarks